United States Patent
Lee (10) Patent No.: US 7,560,968 B2
(45) Date of Patent: Jul. 14, 2009

(54) OUTPUT DRIVER CAPABLE OF CONTROLLING A SHORT CIRCUIT CURRENT

(75) Inventor: Dong-Jin Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 192 days.

(21) Appl. No.: 11/609,660

(22) Filed: Dec. 12, 2006

(65) Prior Publication Data

US 2007/0182462 A1 Aug. 9, 2007

(30) Foreign Application Priority Data

Feb. 9, 2006 (KR) .................. 10-2006-0012576

(51) Int. Cl.
*H03H 11/26* (2006.01)
(52) U.S. Cl. .................. 327/263; 327/265; 327/112
(58) Field of Classification Search .................. 327/108, 327/112, 261–265, 284–286
See application file for complete search history.

(56) References Cited

U.S. PATENT DOCUMENTS

| 7,015,721 | B2 * | 3/2006 | Nguyen et al. ............... 326/83 |
| 7,038,512 | B2 * | 5/2006 | Wilson et al. ............... 327/170 |
| 7,135,896 | B2 * | 11/2006 | Kobayashi ................ 327/108 |
| 7,282,968 | B2 * | 10/2007 | Lee ........................... 327/112 |

FOREIGN PATENT DOCUMENTS

| JP | 2005-045347 | 2/2005 |
| KR | 1020020022919 A | 3/2002 |
| KR | 1020050059920 A | 6/2005 |

* cited by examiner

*Primary Examiner*—Lincoln Donovan
*Assistant Examiner*—Hai L. Nguyen
(74) *Attorney, Agent, or Firm*—F. Chau & Assoc., LLC

(57) ABSTRACT

An output driver capable of controlling a short circuit current includes a driving unit and a driving control unit. The driving unit receives a first driving signal and a second driving signal in response to a control signal and generates an output signal. The driving unit control unit includes a driving unit copying unit having the same construction as the driving unit and compares an output copying signal generated from the first and second driving signals by the driving unit copying unit with a reference voltage and generates the control signal that controls delays of the first and second driving signals in a test mode.

30 Claims, 6 Drawing Sheets

OUTPUT DRIVER CAPABLE OF CONTROLLING A SHORT CIRCUIT CURRENT

CROSS-REFERENCE TO RELATED PATENT APPLICATION

This application claims the benefit of Korean Patent Application No. 10-2006-0012576, filed on Feb. 9, 2006, in the Korean Intellectual Property Office, the disclosure of which is incorporated herein in its entirety by reference.

BACKGROUND OF THE INVENTION

1. Technical Field

The present disclosure relates to a semiconductor memory device, and more particularly, to an output driver that is capable of a controlling short circuit current.

2. Discussion of the Related Art

With the development of high-performance memory systems, the operating frequencies thereof are increasing. Typically, a variety of memory devices are connected to a memory system bus. For example, when a DRAM is connected to a bus line, the DRAM should satisfy a predetermined requirement corresponding to the operational demands of a memory system. More specifically, the output driver of the DRAM should satisfy a requirement of controlling the current that might be caused by the occurrence of a short circuit.

Figure 1A:
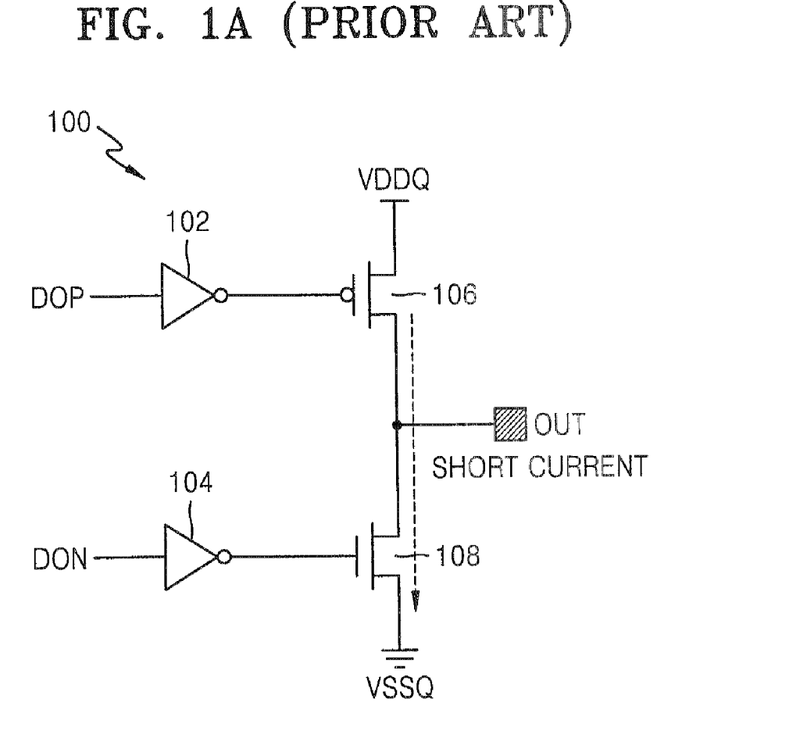
FIGS. 1A and 1B are a circuit diagram and an operational timing diagram, respectively, of a conventional output driver.
Figure 1B:
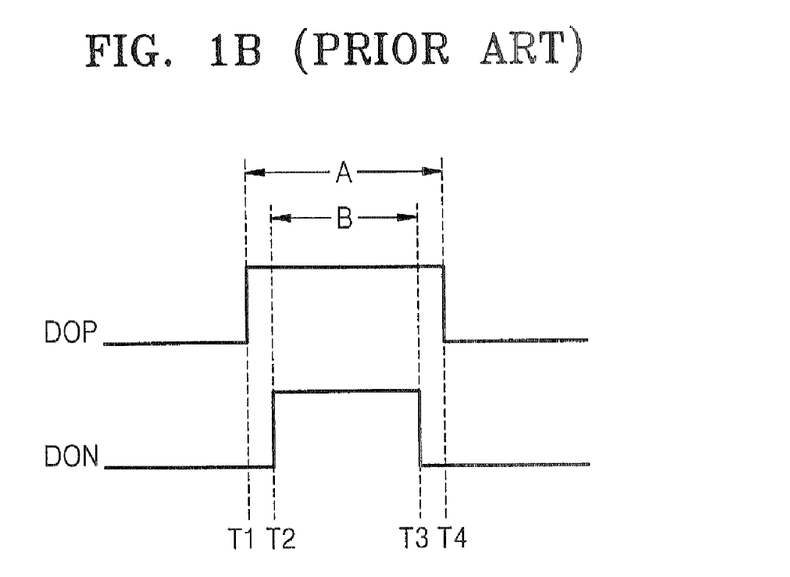

FIGS. 1A and 1B are a circuit diagram and an operational timing diagram, respectively, of a conventional output driver. Referring to FIG. 1A, an output driver 100 includes a first inverter 102 receiving a first driving signal DOP, a second inverter 104 receiving a second driving signal DON, and a PMOS transistor 106 and an NMOS transistor 108 that are serially connected between a power supply voltage VDDQ and a ground voltage VSSQ. An output of the first inverter 102 is connected to a gate of the PMOS transistor 106. An output of the second inverter 104 is connected to a gate of the NMOS transistor 108.

Referring to FIG. 1B, a logic high pulse section B of the second driving signal DON exists within a logic high pulse section A of the first driving signal DOP. During the period between time T1 and time T2, the PMOS and NMOS transistors 106 and 108 of the output driver 100 are both turned on and, thus, a short circuit current flows from the power supply voltage VDDQ to the ground voltage VSSQ. During the period between time T3 and time T4, the PMOS and NMOS transistors 106 and 108 of the output driver 100 are both turned on again and, thus, the short circuit current flows from the power supply voltage VDDQ to the ground voltage VSSQ.

Short circuit current functions as a factor that impedes the performance of a memory system. Thus, there remains a demand for an output driver that can control the short circuit current.

SUMMARY OF THE INVENTION

Exemplary embodiments of the present invention provide an output driver that controls a short circuit current.

According to an exemplary embodiment of the present invention, there is provided an output driver including a driving unit and a driving control unit. The driving unit receives a first driving signal and a second driving signal in response to a control signal and generates an output signal. The driving control unit includes a driving unit copying unit that is identical with the driving unit. The driving control unit compares an output copying signal generated from the first and second driving signals by the driving unit copying unit with a reference voltage and generates a control signal that controls the delays of the first and second driving signals in a test mode.

According to an exemplary embodiment of the present invention, there is provided an output driver including: a driving unit receiving a first driving signal and a second driving signal in response to a control signal and generating an output signal in response to the first and second driving signals; a driving unit copying unit receiving the first and second driving signals in response to the control signal and generating an output copying signal and a ground copying signal in response to the first and second driving signals; a copying unit precharge unit providing a power supply voltage as the output copying signal; a copying unit enable unit providing a ground voltage as the ground copying signal; a reference voltage generation unit generating a reference voltage form the power supply voltage; and a comparison unit comparing the output copying signal with the reference voltage and generating the control signal.

According to an exemplary embodiment of the present invention, there is provided an output driver including: a switching unit transmitting the control signal to a first switching terminal or a second switching terminal in response to a control signal; a driving unit receiving a first driving signal or a second driving signal in response to the control signal received via the first switching terminal or the second switching terminal and generating an output signal in response to the first and second driving signals; a driving unit copying unit receiving the first and second driving signals in response to the control signal received via the first switching terminal or the second switching terminal and generating an output copying signal and a ground copying signal in response to the first and second driving signals; a copying unit precharge unit providing a power supply voltage as the output copying signal; a copying unit enable unit providing a ground voltage as the ground copying signal; a reference voltage generation unit generating a reference voltage from the power supply voltage; and a comparison unit comparing the output copying signal with the reference voltage and generating the control signal.

According to an exemplary embodiment of the present invention, there is provided an output driver comprising: a driving unit receiving a first driving signal or a second driving signal in response to a plurality of counter bit signals and generating an output signal in response to the first and second driving signals; a driving unit copying unit receiving the first and second driving signals in response to the counter bit signals and outputting an output copying signal and a ground copying signal; a copying unit precharge unit providing a power supply voltage as the output copying signal; a copying unit enable unit providing a ground voltage as the ground copying signal; a reference voltage generation unit generating a reference voltage from the power supply voltage; a comparison unit comparing the output copying signal with the reference voltage and generating the control signal; and a counter generating the counter bit signals in response to the ground signal, the counter bit signals being up counted or down counted.

According to an exemplary embodiment of the present invention, there is provided an output driver comprising: a switching unit transmitting a plurality of counter bit signals to a first switching terminal or a second switching terminal in response to a control signal; a driving unit receiving a first driving signal or a second driving signal in response to the counter bit signals received via the first switching terminal or the second switching terminal and generating an output signal in response to the first and second driving signals; a driving unit copying unit receiving the first and second driving signals in response to the counter bit signals received via the first switching terminal or the second switching terminal and generating an output copying signal and a ground copying signal in response to the first and second driving signals; a copying unit precharge unit providing a power supply voltage as the output copying signal; a copying unit enable unit providing a ground voltage as the ground copying signal; a reference voltage generation unit generating a reference voltage from the power supply voltage; a comparison unit comparing the output copying signal with the reference voltage and generating the control signal; and a counter generating the counter bit signals in response to the control signal, the counter bit signals being up counted or down counted.

As described above, an output driver according to exemplary embodiments of the present invention includes a driving unit copying unit having the same structure as a driving unit, so that generation of a short circuit current by the driving unit can be prevented by using a control signal or counter bit signals that are generated by testing the short circuit current of the driving unit copying unit.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

The attached drawings for illustrating exemplary embodiments of the present invention are referred to in order to gain a sufficient understanding of the present invention, the merits thereof, and the objectives accomplished by the implementation of the exemplary embodiments of the present invention.

Hereinafter, the present invention will be described in detail by explaining exemplary embodiments with reference to the attached drawings. Like reference numerals in the drawings denote like elements.

Figure 2:
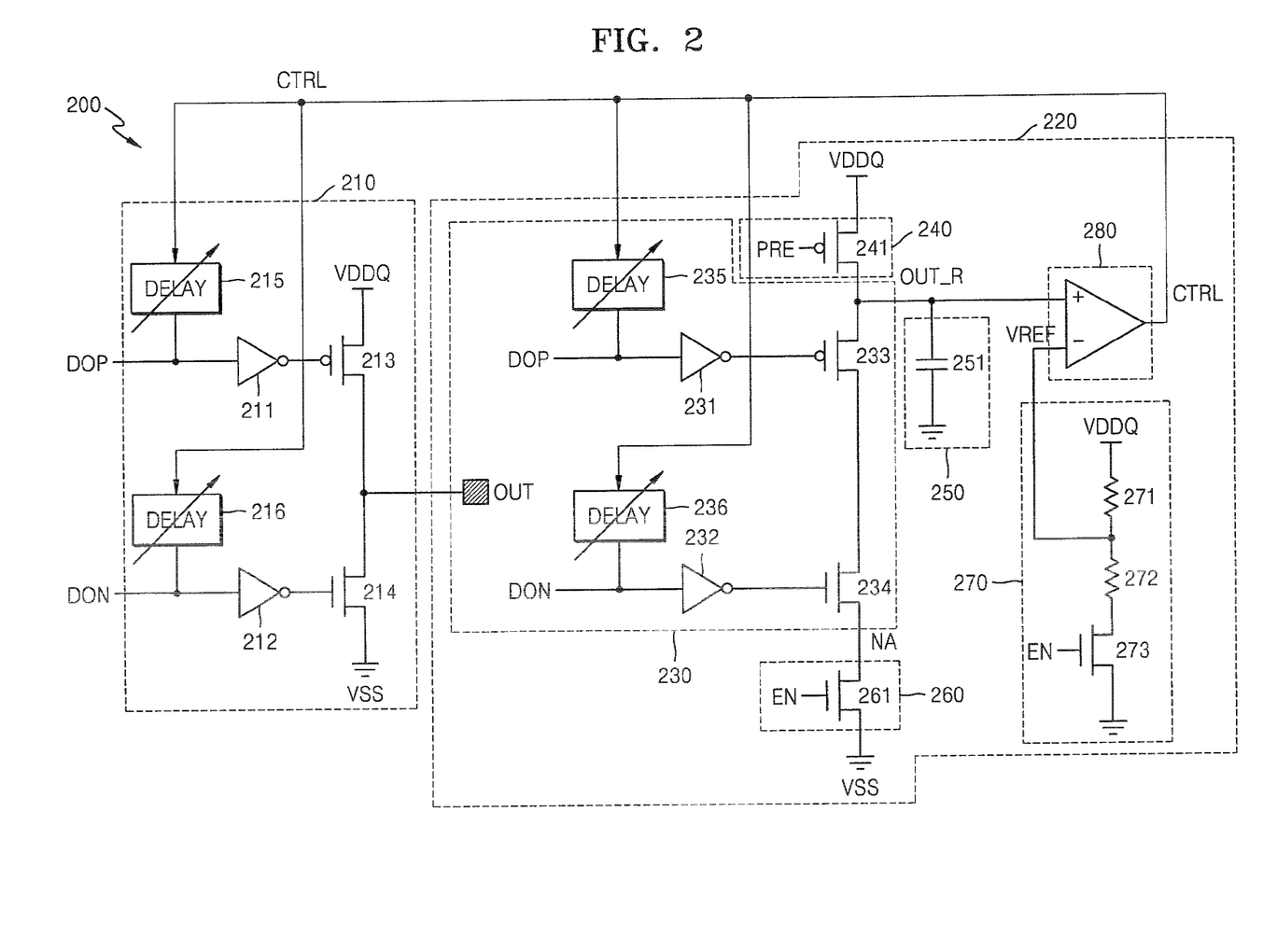
FIG. 2 is a circuit diagram of an output driver according to an exemplary embodiment of the present invention.

FIG. 2 is a circuit diagram of an output driver 200 according to an exemplary embodiment of the present invention. Referring to FIG. 2, the output driver 200 includes a driving unit 210 and a driving control unit 220.

The driving unit 210 generates an output signal OUT in response to a first driving signal DOP and a second driving signal DON. The driving unit 210 includes a first inverter 211 receiving the first driving signal DOP, a second inverter 212 receiving the second driving signal DON, a PMOS transistor 213 and an NMOS transistor 214 serially connected between a power supply voltage VDDQ and a ground voltage VSSQ, a first delay controller 215, and a second delay controller 216. An output of the first inverter 211 is connected to a gate of the PMOS transistor 213. An output of the second inverter 212 is connected to a gate of the NMOS transistor 214. The first and second delay controllers 215 and 216 delay the first and second driving signals DOP and DON in response to a control signal CTRL generated by the driving control unit 220. The first and second delay controllers 215 and 216 may each include delay units having different delay times.

The driving control unit 220 includes a driving unit copying unit 230, a copying unit precharge unit 240, a copying unit enable unit 260, a charge storing unit 250, a reference voltage generation unit 270, and a comparison unit 280.

The driving unit copying unit 230 has the same construction as the driving unit 210. In other words, the driving unit copying unit 230 includes a first inverter 231, a second inverter 232, a PMOS transistor 233, an NMOS transistor 234, a first delay controller 235, and a second delay controller 236.

The copying unit precharge unit 240 precharges an output copying signal OUT_R with the power supply voltage VDDQ in response to a precharge signal PRE. The copying unit precharge unit 240 is connected between the power supply voltage VDDQ and the output copying signal OUT_R and is made up of a PMOS transistor 241 having a gate connected to the precharge signal PRE.

The charge storing unit 250 is made up of a capacitor 251 connected between the output copying signal OUT_R and a ground voltage VSS. The charge storing unit 250 stores a charge received from the PMOS transistor 241 and, thus, keeps the output copying signal OUT_R at the level of the power supply voltage VDDQ.

The copying unit enable unit 260 is serially connected between a ground copying signal NA and the ground voltage VSS and is made up of an NMOS transistor 261 having a gate connected to an enable signal EN. The ground copying signal NA is kept at a ground voltage (VSS) level by the NMOS transistor 261 which is turned on. When the PMOS transistor 241 of the copying unit precharge unit 240 and the NMOS transistor 261 of the copying unit enable unit 260 are turned on, the driving unit copying unit 230 becomes in the same state as the driving unit 210.

The reference voltage generation unit 270 includes a first resistor 271 and a second resistor 272, which are serially connected between the power supply voltage VDDQ and the ground voltage VSS, and an NMOS transistor 273. A node between the first and second resistors 271 and 272 is used as a reference voltage VREF.

The comparison unit 280 compares the output copying signal OUT_R with the reference voltage VREF and generates the control signal CTRL. The control signal CTRL is provided to the first and second delay controllers 215 and 216 of the driving unit 210.

In operation of the output driver 200, first, the output signal OUT of the driving unit 210 is generated in response to the first and second driving signals DOP and DON. In response to the precharge signal PRE and the enable signal EN, the output copying signal OUT_R has the level of the power supply voltage VDDQ, and the ground copying signal NA has the level of the ground voltage VSS, so that the driving unit copying unit 230 operates under the same conditions as the driving unit 210. The reference voltage generation unit 270 generates the reference voltage VREF in response to the enable signal EN.

When the PMOS and NMOS transistors 213 and 214 of the driving unit 210 are turned on by the first and second driving control signals DOP and DON and, thus, short circuit current is generated, as shown in FIG. 1A, the short circuit current also flows in the driving unit copying unit 230. Hence, the voltage level of the output copying signal OUT_R is lowered.

The comparison unit 280 compares the output copying signal OUR_R with the reference voltage VREF and generates the control signal CTRL. When the voltage level of the output copying signal OUT_R is less than the reference voltage VREF, the control signal CTRL becomes logic low. The logic low control signal CTRL is provided to the first and second delay controllers 215 and 216 which both delay the first and second driving signals DOP and DON. Since the first and second delay controllers 215 and 216 are made up of delay units having different delay times, the first and second driving signals DOP and DON are delayed during different periods of time.

The control signal CTRL is also provided to the first and second delay controllers 235 and 236 of the driving unit copying unit 230. The driving unit copying unit 230 delays the first and second driving signals DOP and DON in response to the control signal CTRL and drives the PMOS and NMOS transistors 233 and 234 to generate the output copying signal OUT_R. When a short circuit current is not generated in the driving unit copying unit 230, the output copying signal OUR_R has the level of the power supply voltage VDDQ. The comparison unit 280 compares the power supply voltage VDDQ of the output copying signal OUT_R with the reference voltage VREF and generates a logic high control signal CTRL.

Accordingly, the logic high control signal CTRL is provided to the first and second delay controllers 215 and 216 and stops the first and second driving signals DOP and DON from being delayed. Therefore, no short circuit current flows in the driving unit 210 or in the driving unit copying unit 230.

Figure 3:
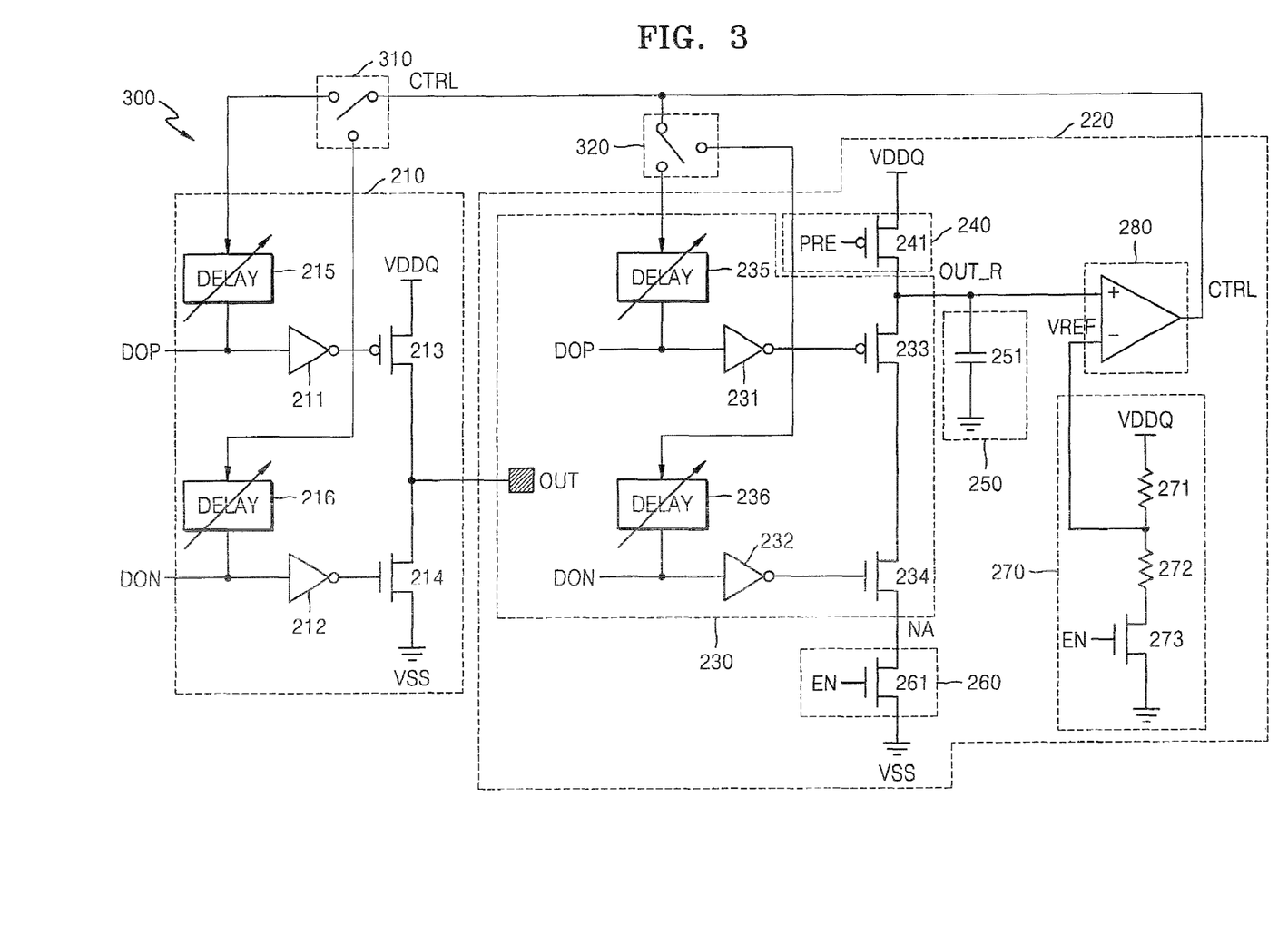
FIG. 3 is a circuit diagram of an output driver according to an exemplary embodiment of the present invention.

FIG. 3 is a circuit diagram of an output driver 300 according to an exemplary embodiment of the present invention. The output driver 300 is different from the output driver 200 of FIG. 2 in that a control signal CTRL is provided to the first and second delay controllers 215 and 216 of the driving unit 210 and the first and second delay controllers 235 and 236 of the driving unit copying unit 230 via switching units 310 and 320. The other elements having the same reference numerals as those in FIG. 2 have the same structures and functions, so a detailed description there will be omitted herein.

As described above with reference to FIG. 2, the first and second delay controllers 215 and 216 may be made up of delay units having different delay times or the same delay times.

For example, when the control signal CTRL is logic high, the switching units 310 and 320 provide the logic high control signal CTRL to the first delay controllers 215 and 235. When the control signal CTRL is logic low, the switching units 310 and 320 provide the logic low control signal CTRL to the second delay controllers 216 and 236. The first and second delay controllers 215, 216, 235, and 236 selectively delay the first and second driving signals DOP and DON in response to the control signal CTRL.

Figure 4:
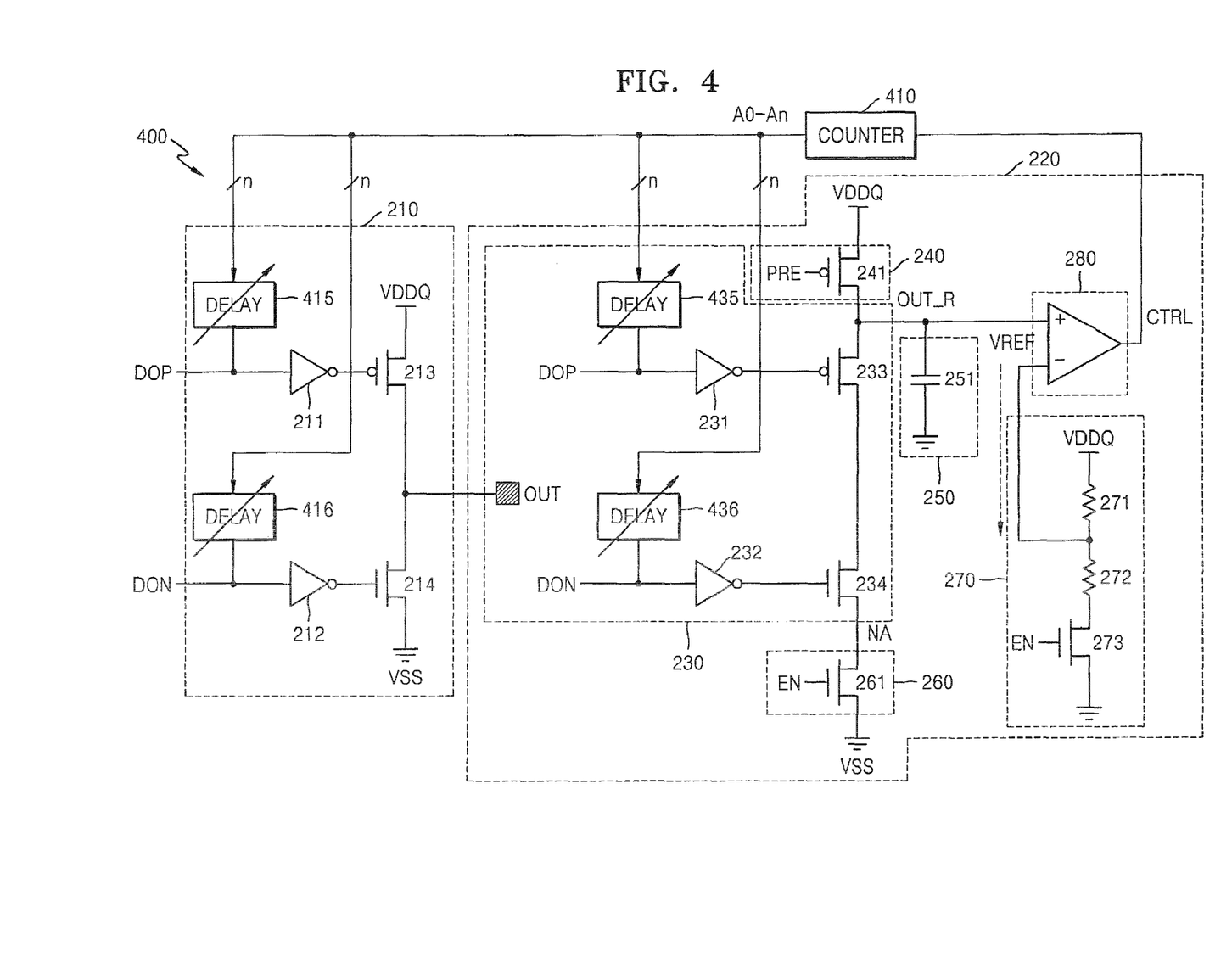
FIG. 4 is a circuit diagram of an output driver according to an exemplary embodiment of the present invention.

FIG. 4 is a circuit diagram of an output driver 400 according to an exemplary embodiment of the present invention. The output driver 400 is different from the output driver 200 of FIG. 2 in that the control signal CTRL is input to a counter 410 and a plurality of bit control signals A0 through An (where n denotes a natural number) are generated. The output driver 400 is also different from the output driver 200 of FIG. 2 in that first delay controllers 415 and 435 and second delay controllers 416 and 436 that control the delays of the first and second driving signals DOP and DON according to the bit control signals A0 through An have structures as show in FIG. 5A or FIG. 5B. The other elements are the same as those of the driver 200 shown in FIG. 2.

Figure 5A:
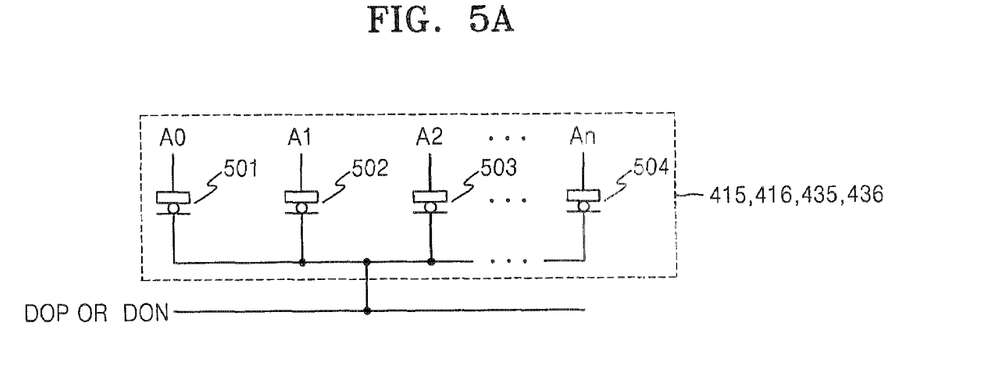
FIGS. 5A and 5B are circuit diagrams of first and second delay controllers used in the driver shown in FIG. 4.
Figure 5B:
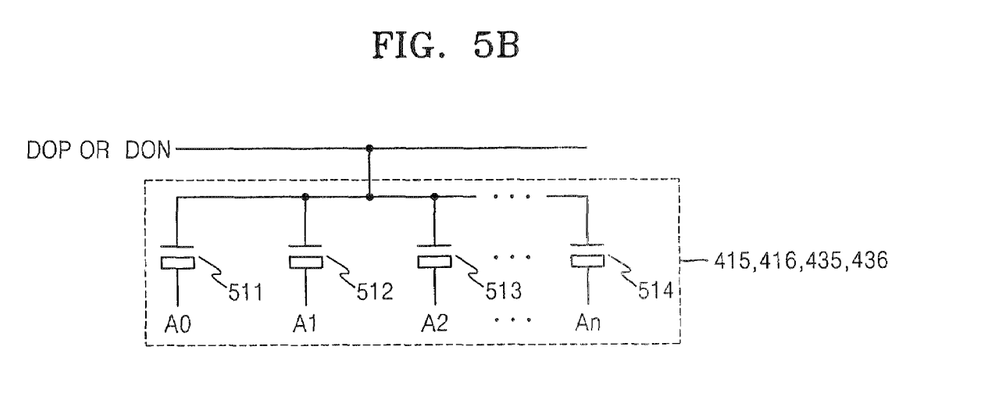

In FIG. 5A, each of the first and second delay controllers 415, 416, 435, and 436 is made up of capacitors 501, 502, 503, and 504 that are implemented as PMOS transistors connected between each of the bit control signals A0 through An and the first or second driving signal DOP or DON. In FIG. 5B, each of the first and second delay controllers 415, 416, 435, and 436 is made up of capacitors 511, 512, 513, and 514 that are implemented as NMOS transistors connected between each of the bit control signals A0 through An and the first or second driving signal DOP or DON. The capacitors 501, 502, 503, 504, 511, 512, 513, and 514 connected to the logic low bit control signals A0 through An delay the first or second driving signal DOP or DON.

Referring back to FIG. 4, the counter 410 generates the bit control signals A0 through An in response to the control signal CTRL generated by the comparison unit 280. The counter 410 executes a down counting according to the logic low control signal CTRL and executes an up counting according to the logic high control signal CTRL. The counting operation of the counter 410 matches well with the operations of delaying the first and second driving signals DOP and DON according to the logic low control signal CTRL described above with reference to FIG. 2.

Figure 6:
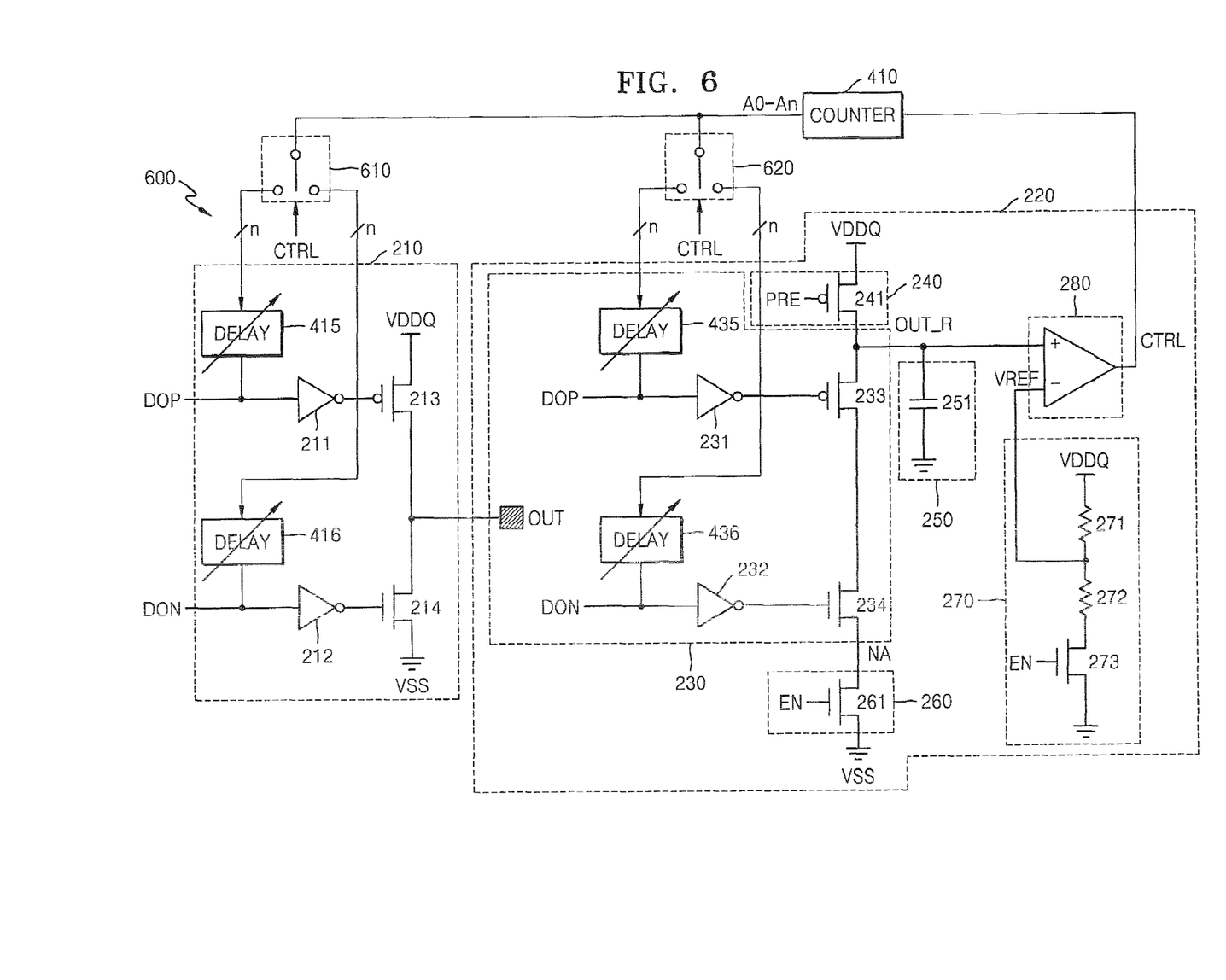
FIG. 6 is a circuit diagram of an output driver according to an exemplary embodiment of the present invention.

FIG. 6 is a circuit diagram of an output driver 600 according to an exemplary embodiment of the present invention. The output driver 600 is different from the output driver 400 of FIG. 4 in that the bit control signals A0 through An generated by the counter 410 are provided to the first and second delay controllers 415 and 416 of the driving unit 210 and the first and second delay controllers 435 and 436 of the driving unit copying unit 230 via switching units 610 and 620. When the control signal CTRL is logic high, the switching units 610 and 620 provide the bit control signals A0 through An to the first delay controllers 415 and 435. When the control signal CTRL is logic low, the switching units 610 and 620 provide the bit control signals A0 through An to the second delay controllers 416 and 436. The first and second delay controllers 415, 416, 435, and 436 selectively delay the first or second driving signal DOP or DON in response to the control signal CTRL and the bit control signals A0 through An.

The driving controllers 220 in the above-described exemplary embodiments of the present invention operate only in a test mode so as to previously control the delays of the first and second driving signals DOP and DON so that a short circuit current is prevented from being generated in the output drivers 200, 300, 400, and 600.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output driver comprising:
   a driving unit receiving a first driving signal and a second driving signal and generating an output signal; and
   a driving control unit including a driving unit copying unit that is identical to the driving unit, the driving control unit comparing an output copying signal generated from the first driving signal and the second driving signal by the driving unit copying unit with a reference voltage and generating a control signal that controls delays applied to the first and second driving signals in a test mode,
   wherein the driving unit includes a first delay controller delaying the first driving signal in response to the control signal, and a second delay controller delaying the second driving signal in response to the control signal.

2. The output driver of claim 1, wherein the driving unit comprises:
a first inverter receiving the first driving signal;
a second inverter receiving the second driving signal;
a PMOS transistor having a source connected to a power supply voltage, a gate connected to an output of the first inverter, and a drain connected to a mode for the output signal; and
an NMOS transistor having a source connected to a ground voltage, a gate connected to an output of the second inverter, and a drain connected to the mode for the output signal 3. The output driver of claim 1, wherein the driving control unit comprises:
the driving unit copying unit receiving the first and second driving signals and generating the output copying signal in response to the first and second driving signals;
a reference voltage generation unit generating the reference voltage from a power supply voltage; and
a comparison unit comparing the output copying signal with the reference voltage and generating the control signal.

4. The output driver of claim 3, wherein the driving unit copying unit comprises:
a first inverter receiving the first driving signal;
a second inverter receiving the second driving signal;
a PMOS transistor having a source connected to the output copying signal and a gate connected to an output of the first inverter;
an NMOS transistor having a source connected to a ground voltage, a gate connected to an output of the second inverter, and a drain connected to a drain of the PMOS transistor;
a first delay controller delaying the first driving signal in response to the control signal; and
a second delay controller delaying the second driving signal in response to the control signal.

5. The output driver of claim 3, wherein the reference voltage generation unit comprises:
a first resistor connected between the power supply voltage and the reference voltage;
a second resistor having one end connected to the first resistor; and
an NMOS transistor having a drain connected to the other end of the second resistor, a source connected to the ground voltage, and a gate connected to an enable signal.

6. An output driver comprising:
a driving unit receiving a first driving signal and a second driving signal and generating an output signal in response to the first and second driving signals;
a driving unit copying unit receiving the first driving signal and the second driving signal and generating an output copying signal and a ground copying signal in response to the first and second driving signals;
a copying unit precharge unit providing a power supply voltage as the output copying signal;
a copying unit enable unit providing a ground voltage as the ground copying signal;
a reference voltage generation unit generating a reference voltage from the power supply voltage and the ground voltage; and
a comparison unit comparing the output copying signal with the reference voltage and generating a control signal that controls delays applied to the first driving signal and the second driving signal fed to the driving unit and the driving copying unit.

7. The output driver of claim 6, wherein the driving unit comprises:
a first inverter receiving the first driving signal;
a second inverter receiving the second driving signal;
a PMOS transistor having a source connected to the power supply voltage, a gate connected to an output of the first inverter, and a drain connected to a mode for the output signal;
an NMOS transistor having a source connected to the ground voltage, a gate connected to an output of the second inverter, and a drain connected to the output signal;
a first delay controller delaying the first driving signal in response to the control signal; and
a second delay controller delaying the second driving signal in response to the control signal.

8. The output driver of claim 7, wherein each of the first and second delay controllers is made up of delay units having different delay times.

9. The output driver of claim 6, wherein the driving unit copying unit comprises:
a first inverter receiving the first driving signal;
a second inverter receiving the second driving signal;
a PMOS transistor having a source connected to the copying unit precharge unit and a gate connected to an output of the first inverter;
an NMOS transistor having a source connected to the copying unit enable unit, a gate connected to an output of the second inverter, and a drain connected to a drain of the PMOS transistor;
a first delay controller delaying the first driving signal in response to the control signal; and
a second delay controller delaying the second driving signal in response to the control signal.

10. The output driver of claim 9, wherein each of the first and second delay controllers is made up of delay units having different delay times.

11. The output driver of claim 6, wherein the copying unit precharge unit is made up of a PMOS transistor that is connected between the power supply voltage and the output copying signal and has a gate connected to a precharge signal.

12. The output driver of claim 6, wherein the copying unit enable unit is made up of an NMOS transistor that is connected between the ground copying signal and the ground voltage and has a gate connected to an enable signal.

13. The output driver of claim 6, wherein the reference voltage generation unit comprises:
a first resistor connected between the power supply voltage and the reference voltage;
a second resistor having one end connected to the first resistor; and
an NMOS transistor having a drain connected to the other end of the second resistor, a source connected to the ground voltage, and a gate connected to an enable signal.

14. The output driver of claim 13, wherein the driving unit copying unit comprises:
a first inverter receiving the first driving signal;
a second inverter receiving the second driving signal;
a PMOS transistor having a source connected to the copying unit precharge unit and a gate connected to an output of the first inverter;

an NMOS transistor having a source connected to the copying unit enable unit, a gate connected to an output of the second inverter, and a drain connected to a drain of the PMOS transistor;
a first delay controller delaying the first driving signal in response to the delay control signal received via the first switching terminal; and
a second delay controller delaying the second driving signal in response to the delay control signal received via the second switching terminal.

15. The output driver of claim 14, wherein each of the first and second delay controllers is made up of delay units having identical delay times.

16. The output driver of claim 14, wherein each of the first and second delay controllers is made up of delay units having different delay times.

17. An output driver comprising:
a switching unit transmitting a delay control signal to a first switching terminal or a second switching terminal in response to a control signal;
a driving unit receiving a first driving signal and a second driving signal in response to the delay control signal received via the first switching terminal or the second switching terminal and generating an output signal in response to the first driving signal and the second driving signal;
a driving unit copying unit receiving the first driving signal and the second driving signal in response to the delay control signal received via the first switching terminal or the second switching terminal and generating an output copying signal and a ground copying signal in response to the first and second driving signals;
a copying unit precharge unit providing a power supply voltage as the output copying signal;
a copying unit enable unit providing a ground voltage as the ground copying signal;
a reference voltage generation unit generating a reference voltage from the power supply voltage and the ground voltage; and
a comparison unit comparing the output copying signal with the reference voltage and generating the delay control signal.

18. The output driver of claim 17, wherein the driving unit comprises:
a first inverter receiving the first driving signal;
a second inverter receiving the second driving signal;
a PMOS transistor having a source connected to the power supply voltage, a gate connected to an output of the first inverter, and a drain connected to a node for the output signal;
an NMOS transistor having a source connected to the ground voltage, a gate connected to an output of the second inverter, and a drain connected to the node for the output signal;
a first delay controller delaying the first driving signal in response to the delay control signal received via the first switching terminal; and
a second delay controller delaying the second driving signal in response to the delay control signal received via the second switching terminal.

19. The output driver of claim 18, wherein each of the first and second delay controllers is made up of delay units having identical delay times.

20. The output driver of claim 18, wherein each of the first and second delay controllers is made up of delay units having different delay times.

21. An output diver comprising:
a driving unit receiving a first diving signal and a second diving signal in response to a plurality of counter bit signals and generating an output signal based on the first and second driving signals;
a driving unit copying unit receiving the first driving signal and the second driving signal in response to the counter bit signals and outputting an output copying signal and a ground copying signal;
a copying unit precharge unit providing a power supply voltage as the output copying signal;
a copying unit enable unit providing a ground voltage as the ground copying signal;
a reference voltage generation unit generating a reference voltage from the power supply voltage and the ground voltage;
a comparison unit comparing the output copying signal with the reference voltage and generating a control signal; and
a counter generating the counter bit signals in response to the control signal, the counter bit signals being up counted or down counted.

22. The output driver of claim 21, wherein the driving unit comprises:
a first inverter receiving the first driving signal;
a second inverter receiving the second driving signal;
a PMOS transistor having a source connected to the power supply voltage, a gate connected to an output of the first inverter, and a drain connected to a node for the output signal;
an NMOS transistor having a source connected to the ground voltage, a gate connected to an output of the second inverter, and a drain connected to the node for the output signal;
a first delay controller delaying the first driving signal in response to the counter bit signals; and
a second delay controller delaying the second driving signal in response to the counter bit signals.

23. The output driver of claim 22, wherein each of the first and second delay controllers is made up of capacitors that are implemented as transistors connected between each of the counter bit signals and the first or second driving signal.

24. The output driver of claim 21, wherein the driving unit copying unit comprises:
a first inverter receiving the first driving signal;
a second inverter receiving the second driving signal;
a PMOS transistor having a source connected to the copying unit precharge unit and a gate connected to an output of the first inverter;
an NMOS transistor having a source connected to the copying unit enable unit, a gate connected to an output of the second inverter, and a drain connected to a drain of the PMOS transistor;
a first delay controller delaying the first driving signal in response to the counter bit signals; and
a second delay controller delaying the second driving signal in response to the counter bit signals.

25. The output driver of claim 24, wherein each of the first and second delay controllers is made up of capacitors that are implemented as transistors connected between each of the counter bit signals and the first or second driving signal.

26. An output driver comprising:
a switching unit transmitting a plurality of counter bit signals to a first switching terminal or a second switching terminal in response to a control signal;
a driving unit receiving a first driving signal and a second driving signal in response to the counter bit signals received via the first switching terminal or the second switching terminal and generating an output signal based on the first and second driving signals;

a driving unit copying unit receiving the first and second driving signals in response to the counter hit signals received via the first switching terminal or the second switching terminal and generating an output copying signal and a ground copying signal based on the first and second driving signals;

a copying unit precharge unit providing a power supply voltage as the output copying signal;

a copying unit enable unit providing a ground voltage as the ground copying signal;

a reference voltage generation unit generating a reference voltage from the power supply voltage and the ground voltage;

a comparison unit comparing the output copying signal with the reference voltage and generating a control signal; and a counter generating the counter bit signals in response to the control signal, the counter bit signals being up counted or down counted.

27. The output driver of claim 26, wherein the driving unit comprises:

a first inverter receiving the first driving signal;

a second inverter receiving the second driving signal;

a PMOS transistor having a source connected to the power supply voltage, a gate connected to an output of the first inverter, and a drain connected to a node for the output signal;

an NMOS transistor having a source connected to the ground voltage, a gate connected to an output of the second inverter, and a drain connected to the node for the output signal;

a first delay controller delaying the first driving signal in response to the counter bit signals; and a second delay controller delaying the second driving signal in response to the counter bit signals.

28. The output driver of claim 27, wherein each of the first and second delay controllers is made up of capacitors that are implemented as transistors connected between each of the counter bit signals and the first or second driving signal.

29. The output driver of claim 26, wherein the driving unit copying unit comprises:

a first inverter receiving the first driving signal;

a second inverter receiving the second driving signal;

a PMOS transistor having a source connected to the copying unit precharge unit and a gate connected to an output of the first inverter;

an NMOS transistor having a source connected to the copying unit enable unit, a gate connected to an output of the second inverter, and a drain connected to a drain of the PMOS transistor;

a first delay controller delaying the first driving signal in response to the counter bit signals; and a second delay controller delaying the second driving signal in response to the counter bit signals.

30. The output driver of claim 29, wherein each of the first and second delay controllers is made up of capacitors that are implemented as transistors connected between each of the counter bit signals and the first or second driving signal.

* * * * *